(12) United States Patent
Gardner et al.

(10) Patent No.: US 11,476,118 B2
(45) Date of Patent: Oct. 18, 2022

(54) METHOD FOR MANUFACTURING NANOWIRES

(71) Applicant: Microsoft Technology Licensing, LLC, Redmond, WA (US)

(72) Inventors: Geoffrey C. Gardner, West Lafayette, IN (US); Raymond L. Kallaher, West Lafayette, IN (US); Sergei V. Gronin, West Lafayette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 256 days.

(21) Appl. No.: 16/800,758

(22) Filed: Feb. 25, 2020

(65) Prior Publication Data

US 2021/0265161 A1     Aug. 26, 2021

(51) Int. Cl.
| | | |
|---|---|---|
| H01L 21/02 | (2006.01) | |
| B82Y 30/00 | (2011.01) | |
| B82Y 40/00 | (2011.01) | |
| H01L 27/18 | (2006.01) | |
| H01L 29/06 | (2006.01) | |

(52) U.S. Cl.
CPC ........ *H01L 21/02603* (2013.01); *B82Y 30/00* (2013.01); *B82Y 40/00* (2013.01); *H01L 27/18* (2013.01); *H01L 29/0669* (2013.01)

(58) Field of Classification Search
None
See application file for complete search history.

(56) References Cited

U.S. PATENT DOCUMENTS

2014/0080290 A1    3/2014  Eymery et al.

FOREIGN PATENT DOCUMENTS

| DE | 102010012711 A1 | 9/2011 | |
|---|---|---|---|
| WO | 2009135078 A2 | 11/2009 | |
| WO | 2019001753 A1 | 1/2019 | |
| WO | WO-2019001753 A1 * | 1/2019 | ............. H01L 39/06 |

OTHER PUBLICATIONS

"Ultrathin compound semiconductor on insulator layers for high-performance nanoscale transistors" by Ko et al. (Year: 2010).*
"High-Quality InAs/InSb Nanowire Heterostructures Grown by Metal-Organic Vapor-Phase Epitaxy" by Cardoff et al. (Year: 2008).*
"International Search Report and Written Opinion Issued in PCT Application No. PCT/US2021/012128", dated May 10, 2021, 34 Pages.

\* cited by examiner

*Primary Examiner* — Evren Seven
(74) *Attorney, Agent, or Firm* — Withrow & Terranova, PLLC

(57) ABSTRACT

A method for manufacturing a nanowire includes providing a sacrificial substrate, providing a patterned mask layer on the sacrificial substrate, providing a nanowire on the sacrificial substrate through an opening in the patterned mask layer, and removing the sacrificial substrate. Because the sacrificial substrate is used for growing the nanowire and later removed, the material of the sacrificial substrate can be chosen to be lattice matched with the material of the nanowire without regard to the electrical properties thereof. Accordingly, a high-quality nanowire can be grown and operated without the degradation in performance normally experienced when using a lattice matched substrate.

19 Claims, 17 Drawing Sheets

SACRIFICIAL SUBSTRATE
10

FIG. 2A

METHOD FOR MANUFACTURING NANOWIRES

FIELD OF THE DISCLOSURE

The present disclosure is related to nanowires, and in particular to improved methods for manufacturing nanowires.

BACKGROUND

Nanowires show great promise for applications in quantum computing. Unfortunately, it is difficult to manufacture high quality nanowires in precise device geometries. Conventional processes for manufacturing nanowires include selective-area-growth (SAG) wherein nanowires are selectively grown directly on a substrate through a patterned mask layer. For many nanowire devices to function properly, the nanowires must be made of a conducting semiconductor material such as indium arsenide (InAs), indium antimonide (InSb), or indium arsenide antimonide (InAsSb). The substrate on which the nanowires are grown then must be an electrically insulating material at all relevant device operating frequencies, including RF. Examples of substrate materials meeting these criteria include gallium arsenide (GaAs), indium phosphide (InP), gallium phosphide (GaP), silicon (Si), and germanium (Ge). There is often a large difference in the crystal lattice constant of the substrate and the nanowires. This crystal lattice mismatch causes crystalline defects in the nanowires during growth such as dislocations and stacking faults. The crystalline defects can penetrate the nanowires and in turn decrease the performance of the resulting nanowires.

In light of the above, there is a need for nanowires with reduced crystalline defects and methods of manufacturing the same.

SUMMARY

In one embodiment, a method for manufacturing a nanowire includes providing a sacrificial substrate, providing a patterned mask layer on the sacrificial substrate, providing a nanowire on the sacrificial substrate through an opening in the patterned mask layer, and removing the sacrificial substrate. Because the sacrificial substrate is used for growing the nanowire and later removed, the material of the sacrificial substrate can be chosen to be lattice matched with the material of the nanowire without regard to the electrical properties thereof. Accordingly, a high-quality nanowire can be grown and operated without the degradation in performance normally experienced when using a lattice matched substrate.

In one embodiment, the sacrificial substrate is removed by a mechanical process such as polishing or grinding. In another embodiment, the sacrificial substrate is removed by a selective etching process. A sacrificial layer may be provided between the sacrificial substrate and the nanowire to facilitate the selective etching process in some embodiments.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 2A through 2G-2 are diagrams illustrating the method of FIG. 1 according to one embodiment of the present disclosure.

FIGS. 4A through 4H-2 are diagrams illustrating the method of FIG. 3 according to one embodiment of the present disclosure.

DETAILED DESCRIPTION

Figure 1:
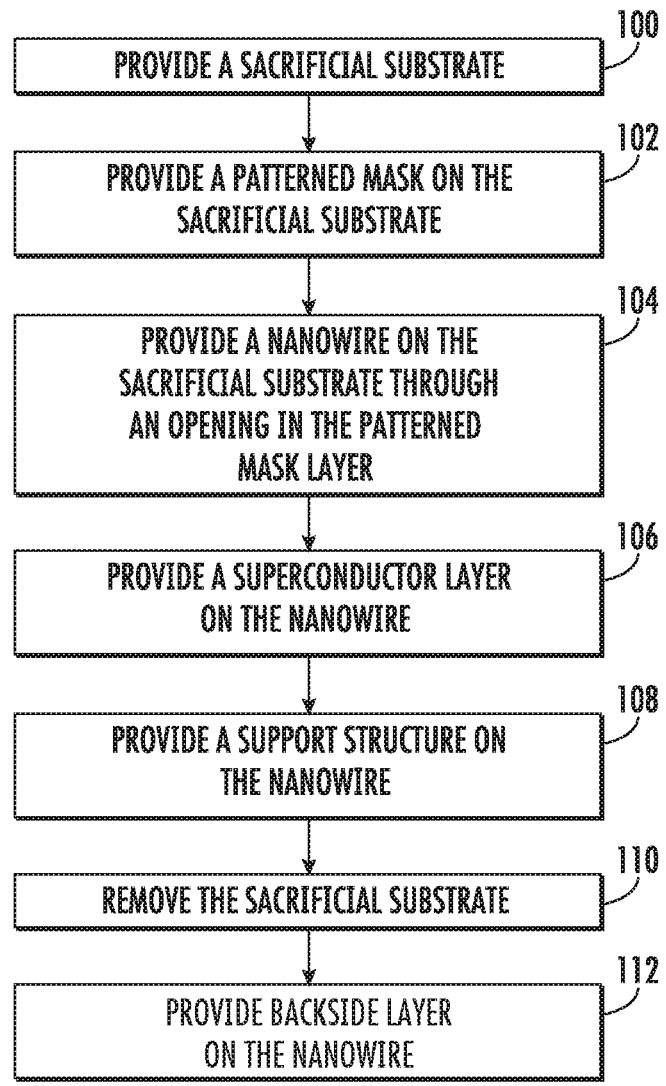
FIG. 1 is a flow chart illustrating a method for manufacturing one or more nanowires according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a flow chart illustrating a method for manufacturing a nanowire according to one embodiment of the present disclosure. FIGS. 2A through 2G illustrate each one of the steps in FIG. 1 and thus FIGS. 1 and 2 are discussed together below. First, a sacrificial substrate 10 is provided (block 100 and FIG. 2A). The sacrificial substrate 10 provides support for growing a high-quality nanowire. Accordingly, the sacrificial substrate 10 is a material that is lattice matched with the material of the nanowire that will be grown on it. As defined herein, materials that are lattice matched have a difference in lattice constant less than 2%. As discussed above, materials that provide good lattice matching for growing nanowires are often incompatible with the operation of the nanowires. This is because materials that provide good lattice matching are often not electrically insulating materials. The sacrificial substrate 10 is removed in a later step as discussed below and thus the electrical properties of the sacrificial substrate are irrelevant. Accordingly, the material of the sacrificial substrate 10 may be chosen solely based on its mechanical properties, namely its lattice constant in order to provide an ideal growth surface for one or more nanowires. Depending on the material of the nanowires grown on the sacrificial substrate 10, the sacrificial substrate may comprise Indium Arsenide (InAs), Indium Antimonide (InSb), or Gallium Antimonide (GaSb).

Figure 2A:
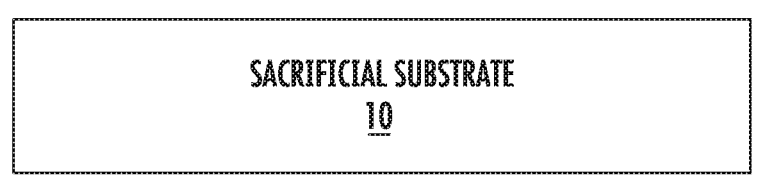
Figure 2B:
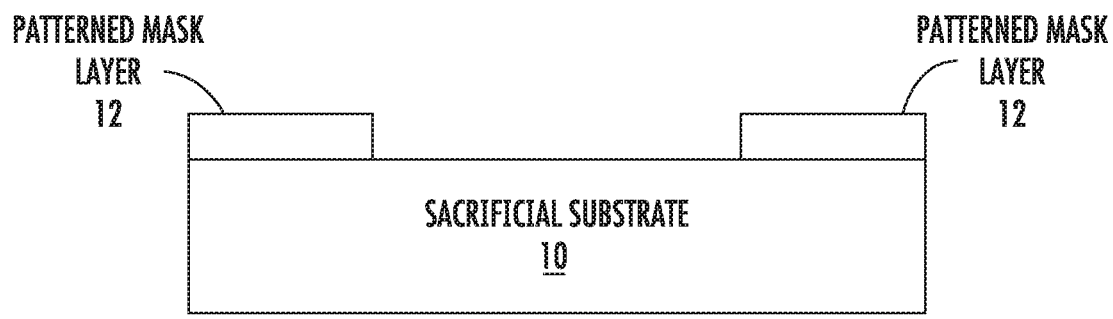

A patterned mask layer 12 is provided on the sacrificial substrate 10 (block 102 and FIG. 2B). The patterned mask layer 12 may comprise an oxide material such as silicon dioxide, or any other suitable material for providing a mask layer. Providing the patterned mask layer 12 may comprise providing a blanket mask layer then patterning the blanket mask layer using a lithography process. One or more openings in the patterned mask layer 12 expose a surface of the sacrificial substrate 10 on which one or more nanowires can be grown.

Figure 2C:
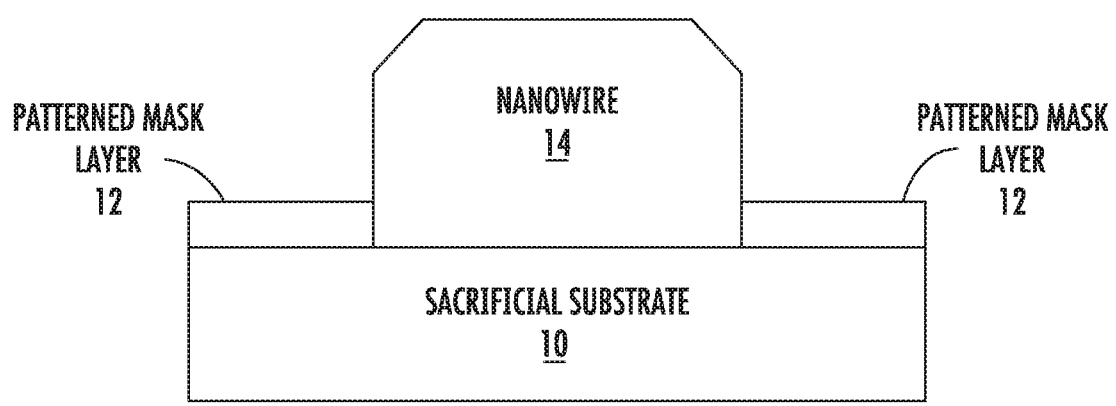

A nanowire 14 is provided on the sacrificial substrate 10 through an opening in the patterned mask layer 12 (block 104 and FIG. 2C). Providing the nanowire 14 may comprise growing the nanowire 14 using a selective area growth (SAG) process. While the nanowire 14 is shown as a unified structure, the nanowire 14 may include any number of nanowire layers, which may be grown together or separately, and may comprise the same or different materials. The nanowire 14 may comprise, for example, indium arsenide (InAs), indium antimonide (InSb), and indium arsenide antimonide (InAsSb). The nanowire may have a thickness between 5 nm and 300 nm. Further, the nanowire 14 may have a diameter on the order of a nanometer ($10^{-9}$ meters) or a ratio of length to width greater than 1000. Because the material of the sacrificial substrate 10 is chosen to be lattice matched with the material of the nanowire 14, the resulting quality of the nanowire 14 can be very high. In other words, the nanowire 14 may have very few, if any defects such as dislocations and stacking faults, thereby improving the performance of the nanowire 14.

Figure 2D:
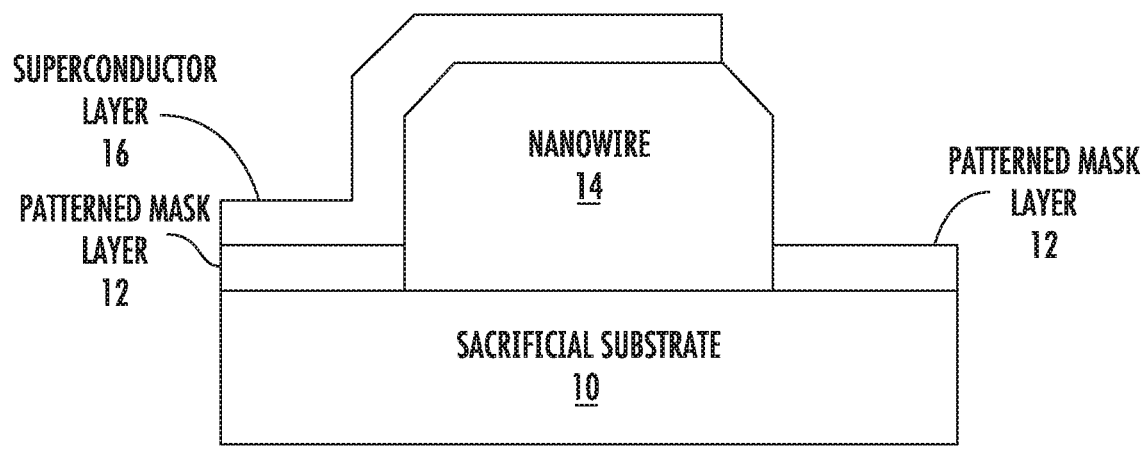

A superconductor layer 16 is provided on the nanowire 14 (block 106 and FIG. 2D). The superconductor layer 16 may also be provided on a portion of the patterned mask layer 12. The superconductor layer 16 may be provided by any suitable deposition process. The superconductor layer 16 may comprise one of aluminum, lead, niobium, indium, tin, and vanadium. A thickness of the superconductor layer 16 may be between 3 nm and 30 nm.

Figure 2E:
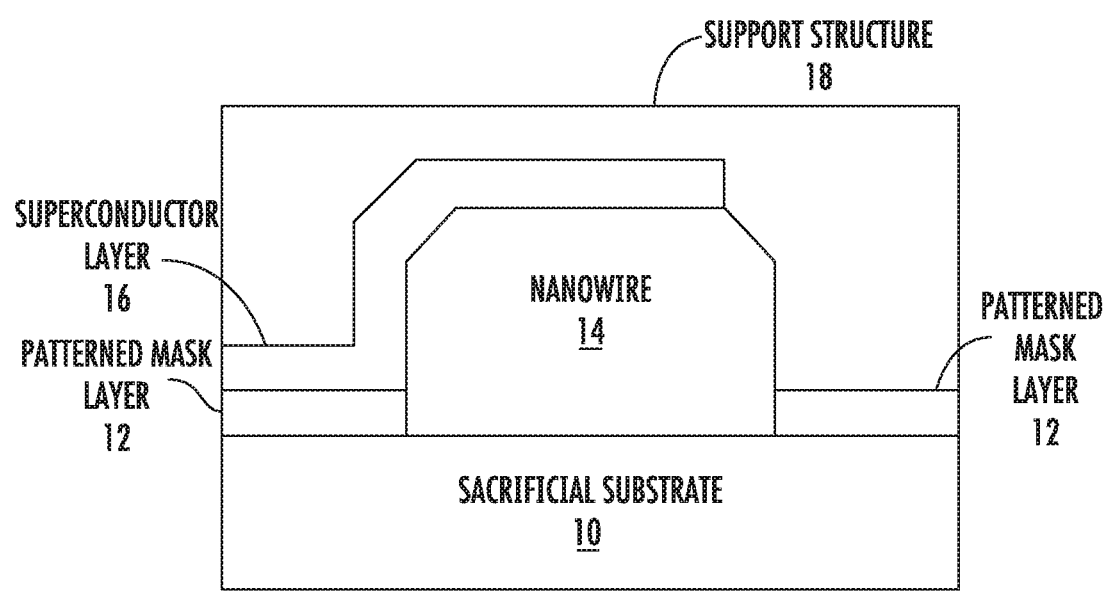

A support structure 18 is provided on the nanowire 14 and the superconductor layer 16 (block 108 and FIG. 2E). The support structure 18 may comprise a dielectric material such as silicon nitride (SiN), or silicon dioxide ($SiO_2$), or may comprise an organic polymer film. The support structure 18 is provided to give mechanical support to the nanowire 14 to allow removal of the sacrificial substrate 10 as discussed below. The support structure 18 may be provided by any suitable deposition process for a dielectric, including both in-situ and ex-situ processes.

Figure 2F:
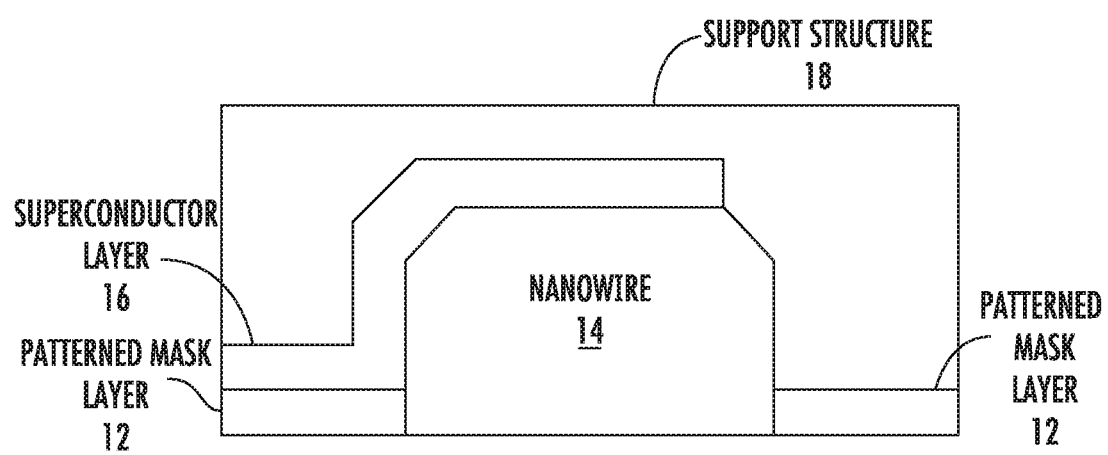

The sacrificial substrate 10 is removed (block 110 and FIG. 2F). The sacrificial substrate 10 may be removed by any suitable process, such as by a mechanical process (e.g., polishing/grinding) or a chemical process (e.g., selective etching). While not shown in FIG. 2F, the patterned mask layer 12 may also be removed. As discussed above, the sacrificial substrate 10 provides an ideal growth substrate for the nanowire 14 because the material of the sacrificial substrate 10 is chosen to be lattice matched with the material of the nanowire 14. However, the sacrificial substrate 10 does not have desirable electrical properties for the operation of the nanowire 14. By providing the sacrificial substrate 10 as a growth substrate and later removing it, a high-quality nanowire 14 can be grown without interfering with the later operation of the nanowire 14. Further, the sacrificial substrate 10 may be reused in some cases, thereby reducing waste and cost of manufacturing.

Figures 1, 2G:
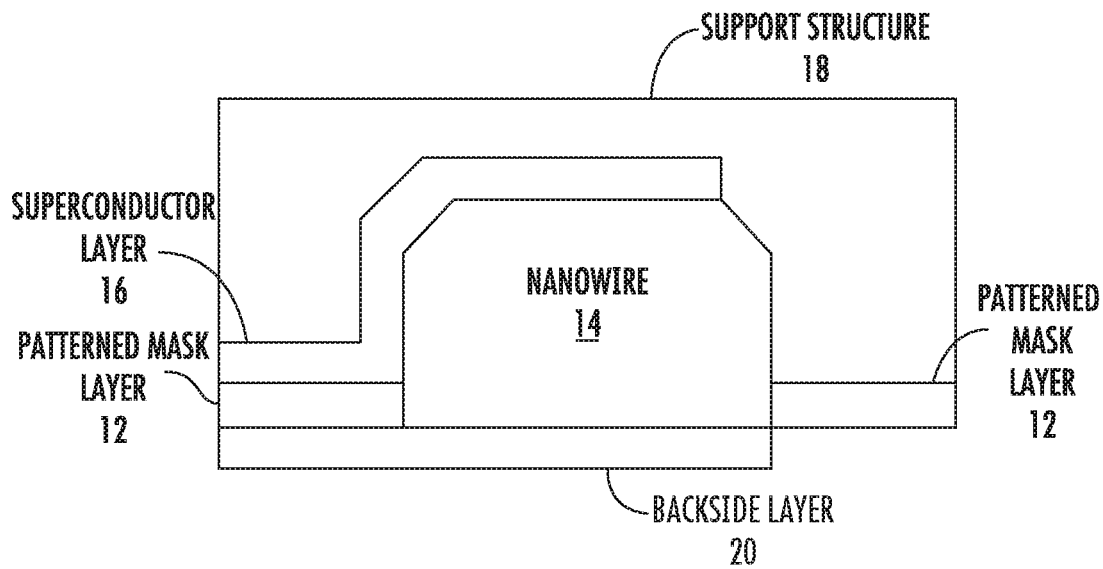
Figures 2, 2G:
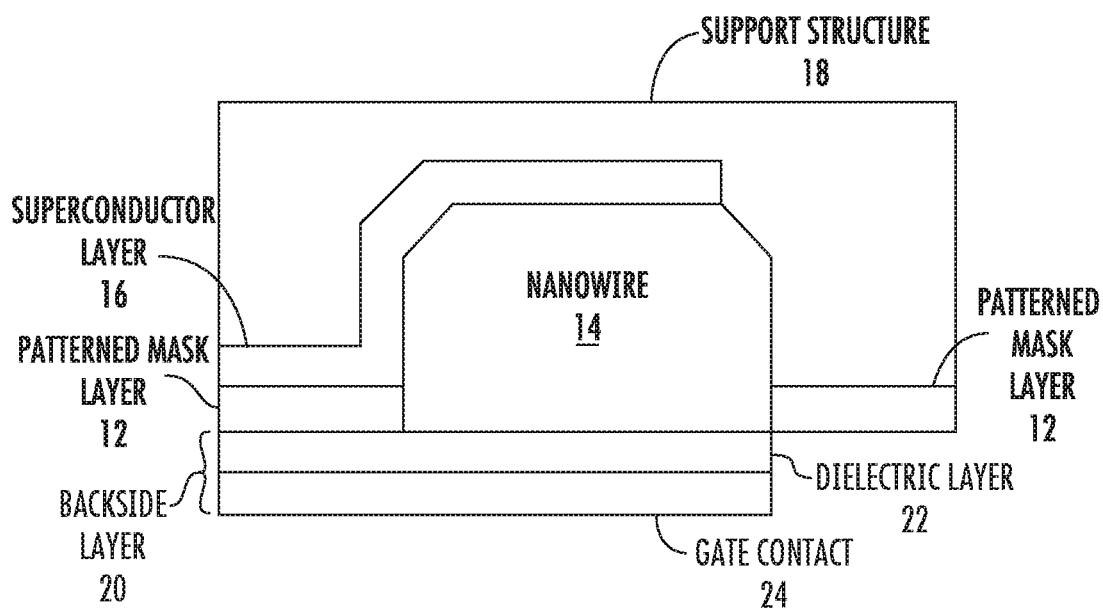

Optionally, a backside layer 20 may be provided on the nanowire 14 (block 112 and FIGS. 2G-1 and 2G-2). In some embodiments, the backside layer 20 is a single capping layer or an additional superconductor layer as illustrated in FIG. 2G-1. In other embodiments, the backside layer 20 is a gate structure including a dielectric layer 22 and gate contact 24 on the dielectric layer 22 as illustrated in FIG. 2G-2. Notably, the backside layer 20 may comprise any number of additional layers configured to perform any desired function without departing from the principles of the present disclosure. While the superconductor layer 16 is provided on a top side of the nanowire 14 in block 108, the backside layer 20 may be provided on a back side of the nanowire 14 exposed after removing the sacrificial substrate 10. Accordingly, the nanowire 14 may effectively be sandwiched between the superconductor layer 16 and the backside layer 20. The backside layer 20 may allow for the creation of an additional electrostatic gate, which may enable additional control over the position of the electron wavefunction in the nanowire 14 and/or the density of electrons therein. Accordingly, the performance of the nanowire 14 may be improved.

Figure 3:
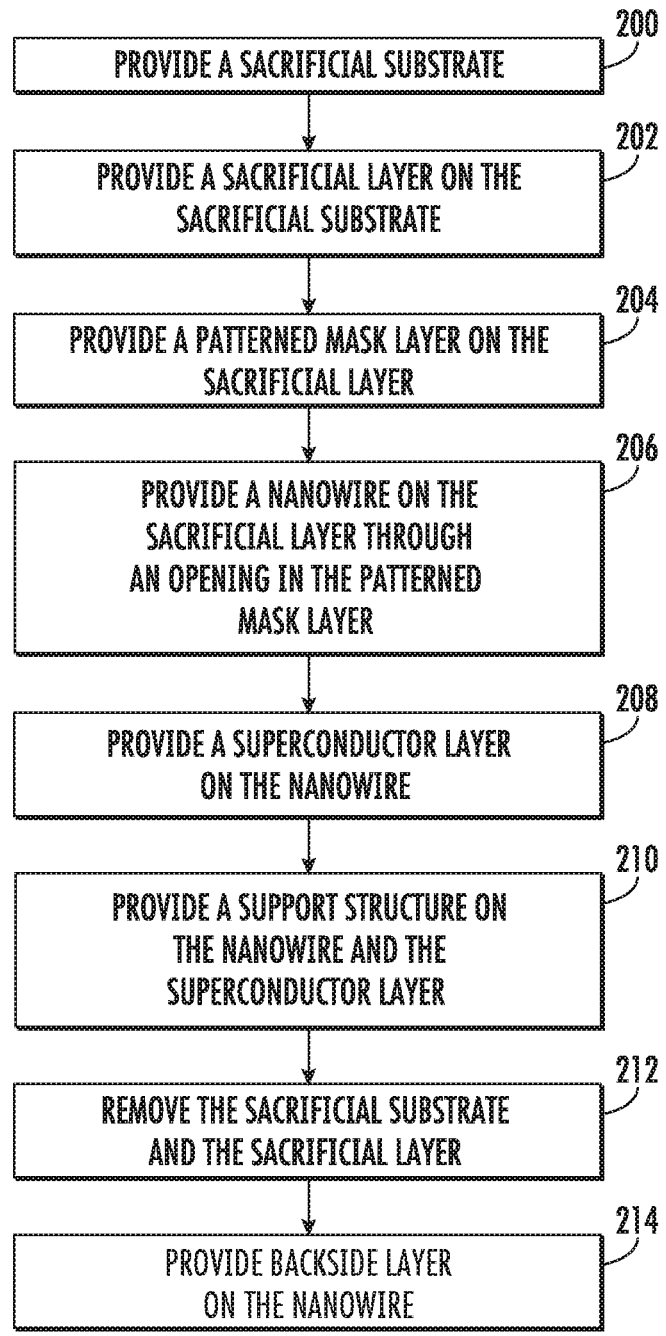
FIG. 3 is a flow diagram illustrating a method for manufacturing one or more nanowires according to one embodiment of the present disclosure.

FIG. 3 is a flow chart illustrating a method for manufacturing a nanowire according to an additional embodiment of the present disclosure. FIGS. 4A through 4H illustrate each one of the steps in FIG. 3 and thus FIGS. 3 and 4 are discussed together below. The method discussed with respect to FIG. 3 is largely the same as that discussed in FIG. 1, and begins by providing the sacrificial substrate 10 (block 200 and FIG. 4A). The sacrificial substrate 10 provides support for growing a high-quality nanowire. Accordingly, the sacrificial substrate 10 is a material that is lattice matched with the material of the nanowire that will be grown on it. Depending on the material of the nanowires grown on the sacrificial substrate 10, the sacrificial substrate 10 may comprise Indium Arsenide (InAs), Indium Antimonide (InSb), Indium phosphide (InP), or Gallium Antimonide (GaSb). In some embodiments, the sacrificial substrate 10 may comprise multiple layers such as a graded buffer layer.

Figure 4A:
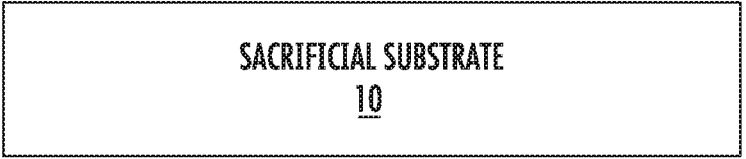
Figure 4B:
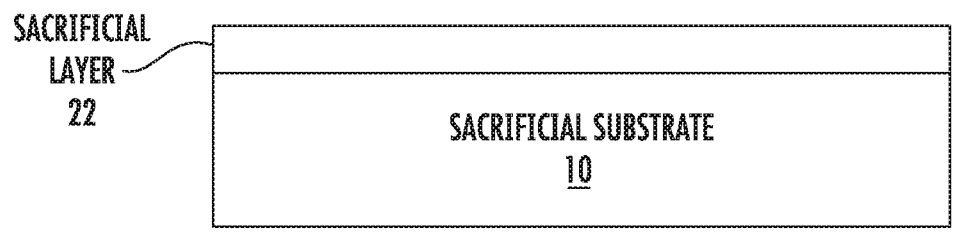

A sacrificial layer 22 is provided on the sacrificial substrate 10 (block 202 and FIG. 4B). The sacrificial layer 22 provides a barrier between the sacrificial substrate 10 and the nanowire that will be grown thereon. A material of the sacrificial layer 22 is chosen to be selectively etchable with respect to the material of the nanowire 14 so that the sacrificial substrate 10 can be easily removed in a later etching process discussed below. In various embodiments, the sacrificial layer 22 may comprise Aluminum Antimonide (AlSb), Aluminum Arsenide (AlAs), and Aluminum Gallium Arsenide (AlGaSb), including an aluminum arsenide etch stop layer. The sacrificial layer 22 may also provide a lattice match with the material of the nanowire 14.

Figure 4C:
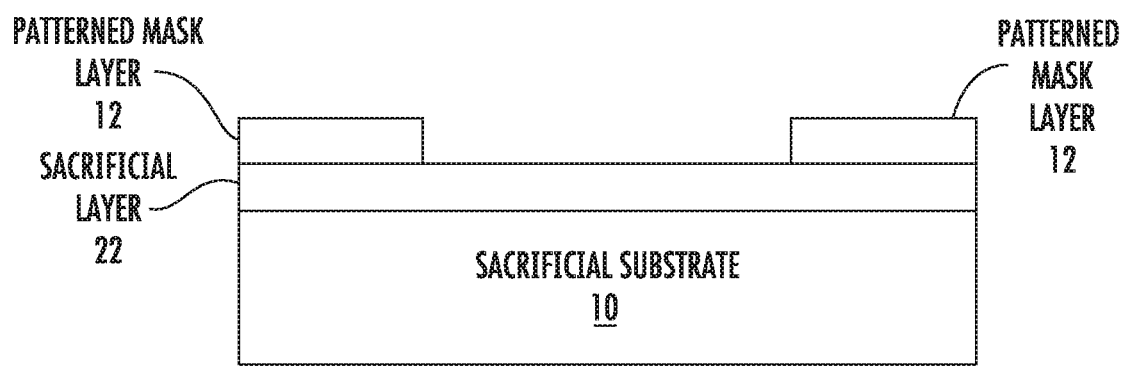

The patterned mask layer 12 is provided on the sacrificial layer 22 (block 204 and FIG. 4C). The patterned mask layer 12 may comprise an oxide material such as silicon dioxide, or any other suitable material for providing a mask layer. Providing the patterned mask layer 12 may comprise providing a blanket mask layer then patterning the blanket mask layer using a lithography process. One or more openings in the patterned mask layer 12 expose a surface of the sacrificial substrate 10 on which one or more nanowires can be grown. While the sacrificial layer 22 is shown as a blanket layer on the sacrificial substrate 10 such that the patterned mask layer 12 is provided on the sacrificial layer 22, in some embodiments the sacrificial layer 22 may only be provided in the openings of the patterned mask layer 12 such that the patterned mask layer 12 is provided on the sacrificial substrate 10 before the sacrificial layer 22.

Figure 4D:
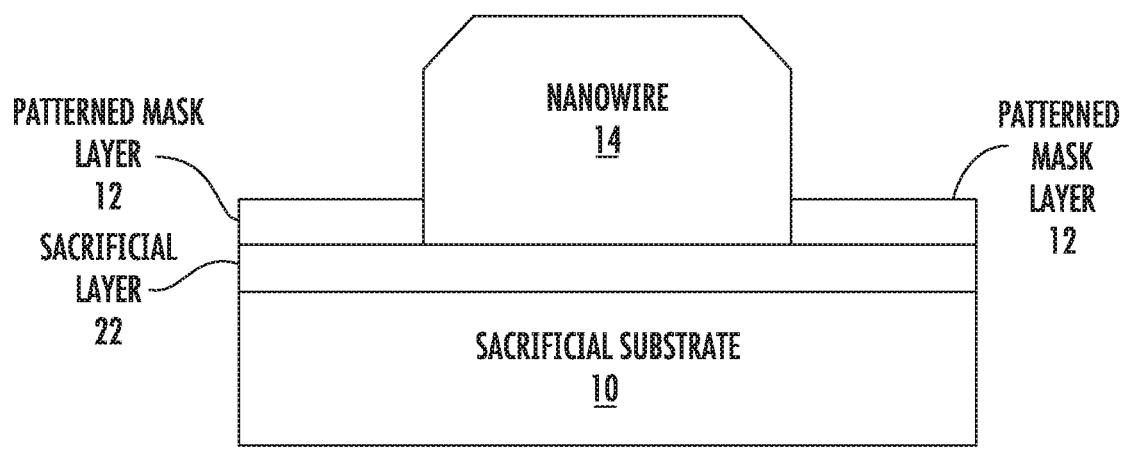

The nanowire 14 is provided on the sacrificial layer 22 through an opening in the patterned mask layer 12 (block 206 and FIG. 4D). Providing the nanowire 14 may comprise growing the nanowire 14 using a selective area growth (SAG) process. While the nanowire 14 is shown as a unified structure, the nanowire 14 may include any number of nanowire layers, which may be grown together or separately, and may comprise the same or different materials. The nanowire 14 may comprise, for example, indium arsenide (InAs) indium antimonide (InSb), and indium arsenide antimonide (InAsSb). The nanowire 14 may have a thickness between 5 nm and 300 nm. Further, the nanowire 14 may have a diameter on the order of a nanometer ($10^{-9}$ meters) or a ratio of length to width greater than 1000. Because the material of the sacrificial substrate 10 and the sacrificial layer 22 are chosen to be lattice matched with the material of the nanowire 14, the resulting quality of the nanowire 14 can be very high. In other words, the nanowire 14 may have very few, if any defects such as dislocations and stacking faults, thereby improving the performance of the nanowire 14.

Figure 4E:
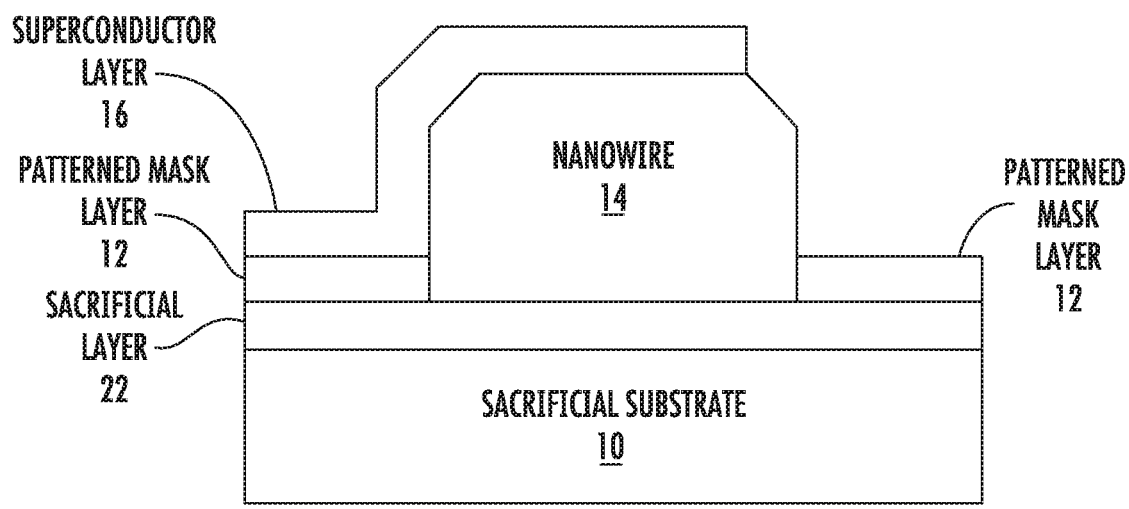

The superconductor layer 16 is provided on the nanowire 14 (block 208 and FIG. 4E). The superconductor layer 16 may also be provided on a portion of the patterned mask layer 12. The superconductor layer 16 may be provided by any suitable deposition process. The superconductor layer 16 may comprise one of aluminum, lead, niobium, indium, tin, and vanadium. A thickness of the superconductor layer 16 may be between 3 nm and 30 nm.

Figure 4F:
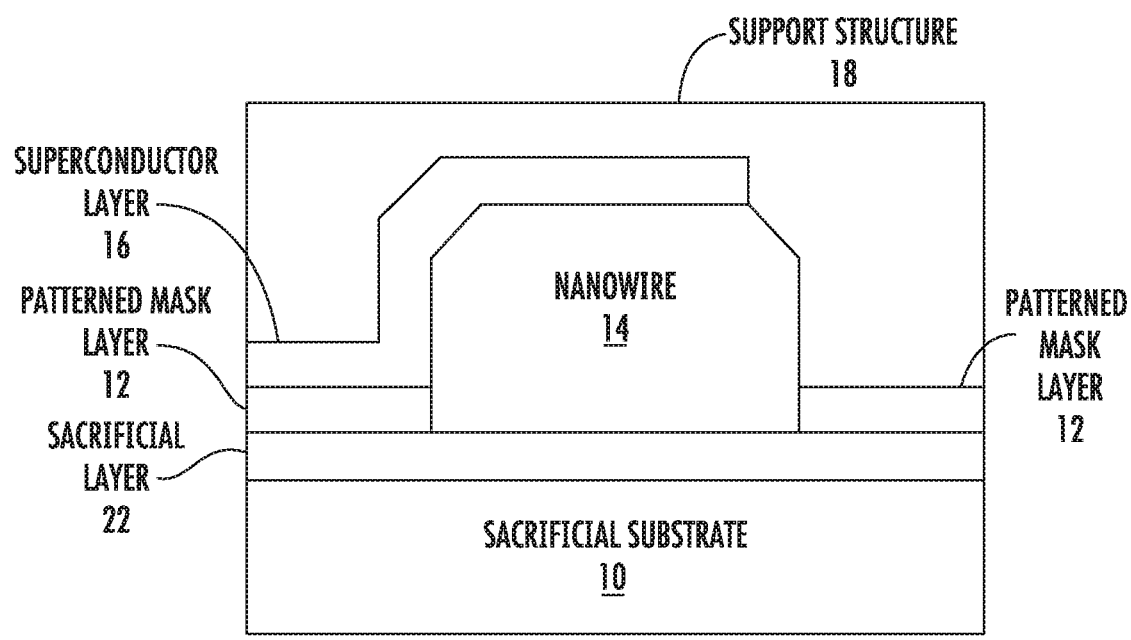

The support structure 18 is provided on the nanowire 14 and the superconductor layer 16 (block 210 and FIG. 4F). The support structure 18 may comprise a dielectric material such as silicon nitride (SiN) silicon dioxide ($SiO_2$), or an organic polymer film. The support structure 18 is provided to give mechanical support to the nanowire 14 to allow removal of the sacrificial substrate 10 as discussed below. The support structure 18 may be provided by any suitable deposition process for a dielectric, including both in-situ and ex-situ processes.

Figure 4G:
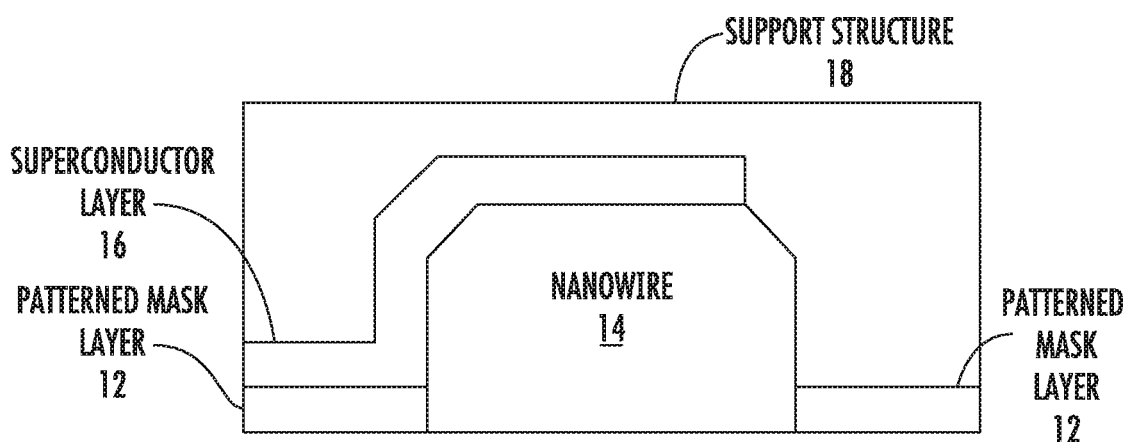

The sacrificial substrate 10 and the sacrificial layer 22 are removed (block 212 and FIG. 4G). While not shown in FIG. 4G, the patterned mask layer 12 may also be removed. As discussed above, removing the sacrificial substrate 10 may comprise selectively etching the sacrificial layer 22, whose material is chosen to be selectively etched with respect to the material of the nanowire 14. By providing the sacrificial substrate 10 as a growth substrate and later removing it, a high-quality nanowire 14 can be grown without interfering with the later operation of the nanowire 14.

Figures 1, 4H:
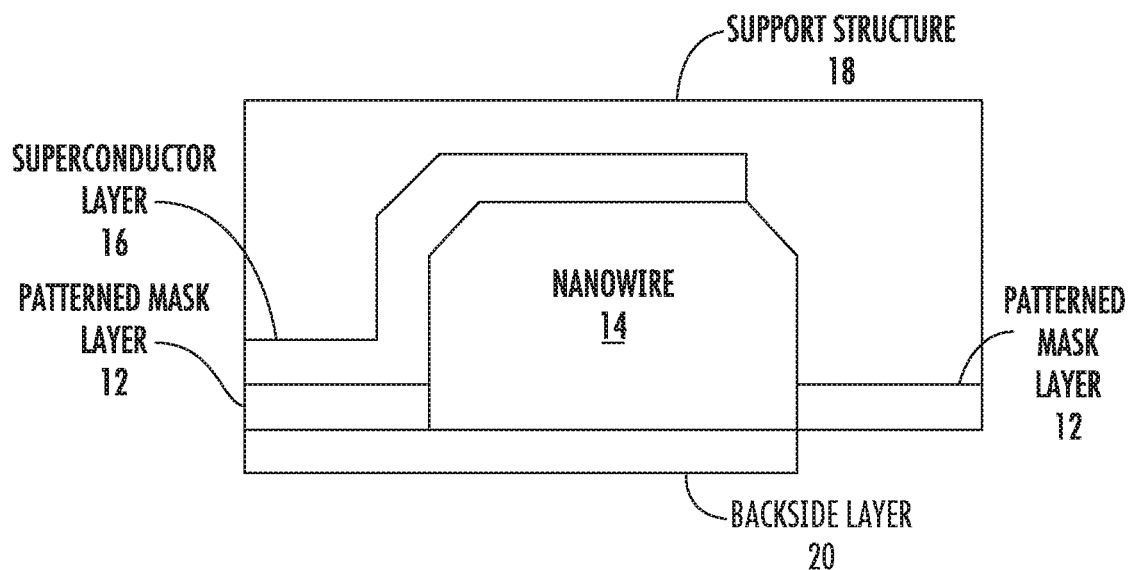
Figures 2, 4H:
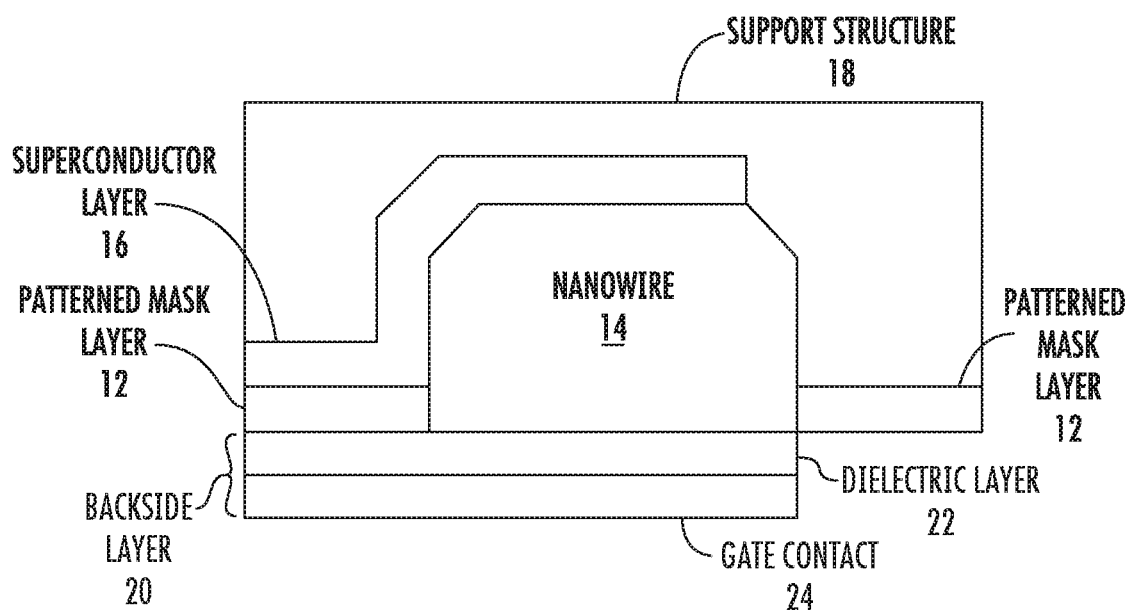

Optionally, the backside layer 20 may be provided on the nanowire 14 (block 214 and FIGS. 4H-1 and 4H-2). As discussed above, the backside layer 20 may comprise a single capping layer or additional superconductor layer as shown in FIG. 4G-1 or a gate control structure including a dielectric layer 22 and a gate contact 24 on the dielectric layer 22 as shown in FIG. 4G-2. Notably, the backside layer 20 may comprise any number of additional layers configured to perform any desired function without departing from the principles of the present disclosure. Specifically, while the superconductor layer 16 is provided on a top side of the nanowire 14 in block 210, the backside layer 20 may be provided on a back side of the nanowire 14 exposed after removing the sacrificial substrate 10. Accordingly, the nanowire 14 may effectively be sandwiched between the superconductor layer 16 and the backside layer 20. The backside layer 20 may allow for the creation of an additional electrostatic gate, which may enable additional control over the position of the electron wavefunction in the nanowire 14 and/or the density of electrons therein. Accordingly, the performance of the nanowire 14 may be improved.

Notably, the processes discussed above are merely illustrative. In general, the present disclosure contemplates growing one or more nanowires on a lattice matched sacrificial substrate, then later removing the sacrificial substrate so that it does not interfere with the operation of the one or more nanowires. Those skilled in the art will appreciate that any suitable process for accomplishing these objectives is contemplated herein.

Those skilled in the art will recognize improvements and modifications to the preferred embodiments of the present disclosure. All such improvements and modifications are considered within the scope of the concepts disclosed herein and the claims that follow.

What is claimed is:

1. A method for manufacturing a nanowire comprising:
   providing a sacrificial substrate;
   providing a patterned mask layer on the sacrificial substrate;
   providing the nanowire on the sacrificial substrate through an opening in the patterned mask layer;
   providing a superconductor layer on a top side of the nanowire;

providing a support structure over the nanowire, the superconductor layer, and the patterned mask layer; and removing the sacrificial substrate after providing the support structure.

2. The method of claim 1 wherein providing the nanowire on the sacrificial substrate comprises growing one or more nanowire layers via a selective area growth process.

3. The method of claim 2 wherein the one or more nanowire layers comprise one or more of indium arsenide, indium antimonide, and indium arsenide antimonide.

4. The method of claim 3 wherein the sacrificial substrate is lattice matched with the one or more nanowire layers.

5. The method of claim 3 wherein the sacrificial substrate comprises one of indium arsenide, gallium arsenide, and indium antimonide.

6. The method of claim 1 wherein the sacrificial substrate is removed mechanically.

7. The method of claim 1 wherein providing the support structure comprises providing a dielectric layer over the nanowire and the patterned mask layer.

8. The method of claim 1 further comprising providing an additional superconductor layer on a bottom side of the nanowire after removing the sacrificial substrate.

9. The method of claim 8 wherein the superconductor layer and the additional superconductor layer comprise one or more of aluminum, lead, niobium, indium, tin and vanadium.

10. The method of claim 1 further comprising providing a sacrificial layer between the nanowire and the sacrificial substrate.

11. The method of claim 10 wherein the sacrificial layer is a blanket layer over the sacrificial substrate.

12. The method of claim 10 wherein removing the sacrificial substrate comprises:

selectively etching the sacrificial layer.

13. The method of claim 12 wherein the sacrificial layer comprises one of aluminum antimonide, aluminum arsenide, and aluminum gallium arsenide.

14. The method of claim 12 wherein providing the nanowire on the sacrificial layer comprises growing one or more nanowire layers via a selective area growth process.

15. The method of claim 14 wherein the one or more nanowire layers comprise one or more of indium arsenide, indium antimonide, and indium arsenide antimonide.

16. The method of claim 15 wherein the sacrificial substrate is lattice matched with the one or more nanowire layers.

17. The method of claim 15 wherein the sacrificial substrate comprises one of indium arsenide, indium antimonide, and gallium antimonide.

18. The method of claim 12 further comprising providing an additional superconductor layer on a bottom side of the nanowire after removing the sacrificial substrate.

19. The method of claim 18 wherein the superconductor layer and the additional superconductor layer comprise one or more of aluminum, lead, niobium, indium, tin and vanadium.

* * * * *